(12) United States Patent
Melanson

(10) Patent No.: US 7,599,462 B2
(45) Date of Patent: Oct. 6, 2009

(54) HYBRID ANALOG/DIGITAL PHASE-LOCK LOOP WITH HIGH-LEVEL EVENT SYNCHRONIZATION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 422 days.

(21) Appl. No.: 11/739,529

(22) Filed: Apr. 24, 2007

(65) Prior Publication Data

US 2008/0075152 A1 Mar. 27, 2008

Related U.S. Application Data

(63) Continuation-in-part of application No. 11/614,368, filed on Dec. 21, 2006.

(60) Provisional application No. 60/826,757, filed on Sep. 25, 2006.

(51) Int. Cl.
*H03D 3/24* (2006.01)
*H03L 7/06* (2006.01)
*H03C 3/06* (2006.01)

(52) U.S. Cl. .......................... 375/376; 327/159; 331/25; 332/128

(58) Field of Classification Search ................. 375/354, 375/373–376; 331/1 A, 18, 25, 1 R; 327/156–160; 332/128

See application file for complete search history.

(56) References Cited

U.S. PATENT DOCUMENTS

| 4,636,734 A | 1/1987 | Genrich |
|---|---|---|
| 5,521,534 A | 5/1996 | Elliott |
| 5,600,379 A * | 2/1997 | Wagner .................... 348/497 |

(Continued)

FOREIGN PATENT DOCUMENTS

WO    WO9933182 A2    7/1999

(Continued)

OTHER PUBLICATIONS

U.S. Appl. No. 11/232,650, dated Sep. 22, 2005, Melanson.

(Continued)

*Primary Examiner*—Don N Vo
(74) *Attorney, Agent, or Firm*—Andrew M. Harris; Mitch Harris, Atty at Law, LLC

(57) ABSTRACT

A hybrid analog/digital phase-lock loop with high-level event synchronization provides a mechanism for generating a low-jitter clock from a timing reference that has a high jitter level and synchronizing the output clock to high-level events. A numerically-controlled analog oscillator provides a clock output and a counter divides the frequency of the clock output to provide input to a digital phase-frequency detector for detecting an on-going phase-frequency difference between the timing reference and the output of the counter. A synchronization circuit detects or receives a high-level event signal, and resets the on-going phase-frequency difference and optionally the counter to synchronize the clock output with the events. The synchronization circuit may have an arming input to enable the synchronization circuit to signal a next event. Another clock output divider may be included to generate a timing reference output, and the other clock divider also reset in response to a detected event.

20 Claims, 5 Drawing Sheets

U.S. PATENT DOCUMENTS

| | | |
|---|---|---|
| 5,786,778 A | 7/1998 | Adams et al. |
| 5,898,744 A | 4/1999 | Kimbrow |
| 6,927,642 B2 | 8/2005 | Hsieh |
| 6,954,114 B2 | 10/2005 | Schoner |
| 7,049,852 B2 | 5/2006 | Melanson |
| 7,092,476 B1 | 8/2006 | Melanson |
| 7,205,804 B2 | 4/2007 | Schoner |
| 7,474,724 B1 * | 1/2009 | Gudmunson et al. ........ 375/376 |
| 7,558,358 B1 * | 7/2009 | Melanson ................... 375/376 |

FOREIGN PATENT DOCUMENTS

WO     WO2004088845 A1     10/2004

OTHER PUBLICATIONS

U.S. Appl. No. 11/082,347, dated Mar. 17, 2005, Jiang et al.
U.S. Appl. No. 11/088,446, dated Mar. 24, 2005, Gudmunson et al.
U.S. Appl. No. 11/082,346, dated Mar. 17, 2005, Gudmunson et al.
U.S. Appl. No. 11/618,784, dated Dec. 30, 2006, Melanson et al.
Office Action in U.S. Appl. No. 11/618,784, filed Nov. 18, 2008.

* cited by examiner

HYBRID ANALOG/DIGITAL PHASE-LOCK LOOP WITH HIGH-LEVEL EVENT SYNCHRONIZATION

CROSS-REFERENCE TO RELATED APPLICATIONS

This application is a Continuation-In-Part of U.S. patent application Ser. No. 11/614,368, filed on Dec. 21, 2006, which is incorporated herein by reference. The above-referenced Parent U.S. Patent application claims priority under 35 U.S.C. §119(e) from U.S. Provisional Patent Application Ser. No. 60/826,757, filed on Sep. 25, 2006.

BACKGROUND OF THE INVENTION

1. Field of the Invention

The present invention relates generally to audio/video (AV) systems, and more specifically, to a synchronizing loop for providing a low-jitter synchronized clock signal that is further synchronized to high-level events.

2. Background of the Invention

Digital audio systems are prevalent in the areas of home entertainment, professional production of multimedia and computer reproduction and generation of multimedia sources. Increasingly, digital audio data is transported from sub-system to sub-system and device to device in both consumer and professional installations. The digital audio data is generally provided with, or has embedded, a timing reference that has too much jitter to act as a stable sample clock reference. Furthermore, the timing information may be provided at a frequency that is lower than the clock rate needed to operate a digital audio sink, such as a digital-to-analog converter (DAC) that receives the incoming digital audio data stream.

Therefore, clock generation circuits that provide stable clock references synchronized to a digital audio stream's timing information are frequently required. The clock generating circuits must generally provide a very low-jitter clock from a timing reference that may have a large amount of jitter present and/or from an additional interface clock that also may have a large amount of jitter.

World Intellectual Property Organization (WIPO) International Publication WO2004/088845A1 entitled "METHOD OF ESTABLISHING AN OSCILLATOR SIGNAL", filed by Christopher Julian Travis on Oct. 14, 2004, discloses such clock synchronizing circuits. A clock generated by an analog phase-lock loop (APLL) is synchronized to incoming time information by using a numerically-controlled oscillator that is controlled by a phase-frequency detector that compares the incoming timing information with a division of the output clock to generate an intermediate clock signal. However, the intermediate clock signal frequency places a limit on the performance of the synchronizing circuit, since the intermediate clock signal frequency typically cannot exceed the divided output clock used for phase comparison in the APLL. Furthermore, the effective information update rate in the phase comparator of the APLL is limited to a single bit of information at the intermediate clock signal frequency. The result is that the loop bandwidth of the APLL must be low enough to remove jitter from the intermediate clock signal, but high enough to remove the inherent noise of the APLL's oscillator.

The constraints on the above-described synchronization circuit reduce applicability of the circuit and place limitations on the jitter-reduction performance obtainable for a given application. The above-incorporated Parent U.S. Patent Application discloses and claims solutions that utilize numerically controlled oscillators to provide the desired jitter reduction. However, in some applications, it is further necessary to provide synchronization to high-level events, such as when synchronizing audio streams to video lines or frames.

Therefore, it would be desirable to provide an improved synchronization circuit and method for generating a low-jitter clock source in synchronization with a jittery timing reference that further incorporates high-level event synchronization.

SUMMARY OF THE INVENTION

The above stated objectives are achieved in a synchronization circuit and method for generating an output clock signal and optionally an output synchronization signal from a timing reference. The method is a method of operation of the circuit.

The circuit includes a numerically-controlled analog oscillator that provides a clock output and has an input for receiving a rational number. The rational number represents a ratio between the frequency of the clock output and the frequency of another stable clock provided to the circuit. A counter divides the frequency of the clock output to provide a phase reference for comparison with an input timing reference. The circuit also includes a digital phase-frequency detector for detecting an on-going phase-frequency difference between the input timing reference and the output of the divider and comparing the phase-frequency difference to an integrated phase value to determine a phase error. The circuit also includes a digital loop filter for filtering the output of the phase-frequency detector to provide the rational number that controls the frequency of the numerically-controlled analog oscillator.

A high-level synchronization event signal is either provided as an input to the circuit, or is extracted from another signal such as the input timing reference. When the high-level event is indicated, the accumulated phase is either reset or the integrated phase value is preset to a present output value of the divider, so that the phase error is reset to zero. The count of the divider may also be reset in response to detection of the high-level event. A second divider may be provided to divide the clock output to generate a synchronization output and the second divider may also be reset in response to the high-level synchronization event signal, so that the synchronization output is also synchronized to the high-level synchronization event signal. An arming signal input may be provided so that the synchronization is performed only in response to a next high-level synchronization event that occurs after the arming signal "arms" the circuit.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses hybrid analog/digital hybrid PLL circuits and methods of operation for providing a low-jitter clock output from a timing reference that may have a large amount of jitter and synchronizing the clock output to a high level event, such as a video line or frame event. A digital PLL is utilized to provide a ratiometric frequency control number that is then provided to a numerically-controlled analog oscillator that generates a low jitter clock output. Feedback may be provided from the clock output to the digital PLL in a feedback configuration, or the numerically controlled oscillator may be operated in a feed-forward configuration. The ratiometric frequency control number is determined from a comparison of an on-going phase integration with the output of a divider that divides either the clock output or a stable clock. The phase integrator is either reset when the high-level event occurs, or is set to the present output value of the divider, so that the accumulated phase error is reset to zero. An arming signal may be provided to arm the synchronization circuit, so that the phase integrator is reset/preset only on a next occurrence of the high-level event after the circuit is "armed".

Figure 1:
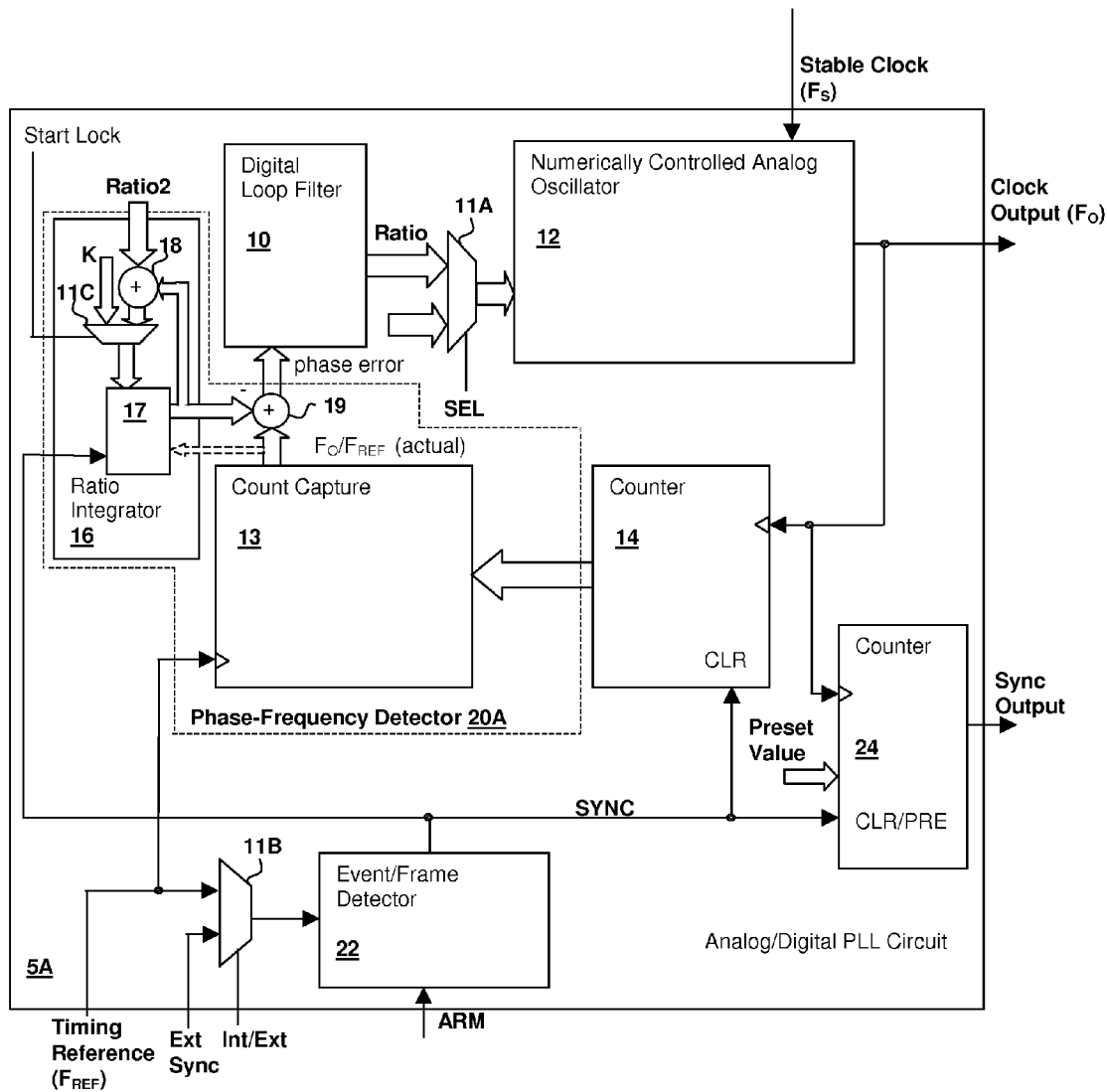
FIG. 1 is a block diagram depicting a circuit in accordance with an embodiment of the present invention.

Referring now to FIG. 1, an exemplary hybrid analog/digital PLL circuit 5A in accordance with an embodiment of the invention is shown. The depicted embodiment is a feedback configuration of the hybrid analog/digital PLL circuit 5A, with feedback provided from the low-jitter Clock Output signal to a phase-frequency detector 20A that compares the frequency of the Clock Output signal to an expected count value determined from an accumulated phase. Phase-frequency comparator 20A includes a count capture circuit 13 that captures the count output of a counter 14 that divides the Clock Output signal by an integer divisor. The count value from a counter 14 is captured at edges of a Timing Reference signal. The captured count value provides a phase number that is the integral of the frequency ($F_O$) of the Clock Output signal over periods of the Timing Reference signal having a frequency ($F_{REF}$) and corresponds to the actual ratio of $F_O/F_{REF}$. The circuit of FIG. 1 thereby provides a low-jitter Clock Output signal that is synchronized to the Timing Reference signal. The Clock Output signal is generated by a numerically controlled analog oscillator 12 in response to a control number Ratio, which represents a rational relationship between the frequency of the Clock Output signal and that of a Stable Clock signal ($F_S$), which is provided to numerically controlled analog oscillator as a reference clock. The control number Ratio is updated by a comparison of the output count of counter 14 at the edges of the Timing Reference signal to an expected accumulated phase provided by a ratio integrator 16. The output of a phase comparator implemented by subtractor 19 is provided to a digital loop filter 10 that filters the phase difference number to provide the control number Ratio.

Subtractor 19 subtracts the expected phase value from ratio integrator 16 from the actual phase value from the output of count capture 13 and thus implements a phase comparator. Ratio integrator 16 integrates a ratio control number Ratio2 using a summer 18 and holds the accumulated value in a latch 17 to provide a number that represents an expected on-going accumulated phase count of the divided clock output provided from counter 14 as adjusted by any frequency offset required to generate the desired Clock Output signal frequency $F_O$ from numerically controlled analog oscillator 12. The combination of counter 14, count capture 13, ratio integrator 16, and subtractor 19 can be viewed as a phase comparator that compares a phase determined from the ratio Ratio2 with a phase determined from the Clock Output signal. Modulo arithmetic is employed in summer 18, ratio integrator 16, and subtractor 19, so that overflow of phase accumulation does not cause ambiguities or error. In particular, the bit width of the count output of counter 14 is equal to that of subtractor 19 and ratio integrator 16 and must be sufficiently wide so that counter 14 will not overflow for the lowest possible Timing Reference signal frequency $F_{REF}$ to which the loop will synchronize. A multiplexer 11C selects between the output of summer 18 and a fixed value K that compensates for the delay through count capture circuit 13 and is preloaded into latch 17 by the Start Lock signal to initialize ratio integrator 16 to produce the proper phase relationship between the Timing Reference signal and the count output of counter 14.

In the depicted embodiment, PLL circuit 5A is further synchronized to a high-level event by an event/frame detector 22, which provides a preset/reset signal SYNC that adjusts the value of ratio integrator 16 when a high-level synchronization event occurs. Ratio integrator 16 may be reset to zero, or to avoid any disruption of the frequency of NCO 12, the captured count value provided from count capture circuit 13 may be loaded into the accumulator that holds the value of ratio integrator 16 in response to the SYNC signal, so that the output of summer 19 is forced to zero. Preset/reset signal SYNC may also clear the value of counter 14 and also clears or sets a secondary synchronization counter 24 to a preset value Preset Value when the high-level synchronization event occurs. Secondary synchronization counter 24 is optionally provided for generating a synchronization output signal Sync Output, which can be used for downstream circuits that also use the clock output signal Clock Output, to synchronize downstream data, such as PCM audio data, with the high level events, such as video lines and/or frames.

Event/frame detector 22 receives a signal provided from selector 11B, which in the illustrated embodiment selects from among signal Timing Reference, for extracting high-level events embedded in the timing reference signal, or a separate signal Ext Sync that bears high-level event information. Event/frame detector 22 also receives an arming signal ARM that can be used to arm event/frame detector 22, so that the SYNC signal is only asserted for the first high-level event provided from selector 11B after the ARM signal is asserted. Such an arming function is useful for applications such as audio/video output interfaces from media-based digital video sources, in which completion of a software-performed transfer or computation generally provides data to output buffers, which can be synchronized for downstream transfer only after the data is ready. Therefore, in order to synchronize such data with an external synchronization reference triggering the high-level events, the source data is held until the next high-level event after the data is ready, as indicated by setting the ARM signal.

Digital loop filter 10 has a bandwidth sufficiently low to remove error due to jitter in the Timing Reference signal so that the Ratio output number from digital loop filter 10, on average, represents the ratio of the frequency $F_S$ of the Stable Clock signal to the frequency $F_O$ of the Clock Output signal. In the depicted embodiment, a selector 11A is provided so that numerically controlled analog oscillator 12 can be operated from a fixed ratio $R_{FIXED}$ when synchronization to the Timing Reference signal and high level events is not required. The $R_{FIXED}$ ratio number may be provided, for example, from a program accessible register in an integrated circuit implementing the circuit of FIG. 1, and is useful in applications such as providing audio playback clock sources where no external Timing Reference is supplied. When selection signal SEL is in a first state, the feedback loop through counter 14 is closed, causing the Clock Output signal to synchronize to the Timing Reference signal with a frequency relationship determined according to the Ratio2 value. When selection signal SEL is in a second state, numerically controlled analog oscillator 12 is provided the fixed ratio $R_{FIXED}$ to control the frequency of the Clock Output signal.

Figure 2:
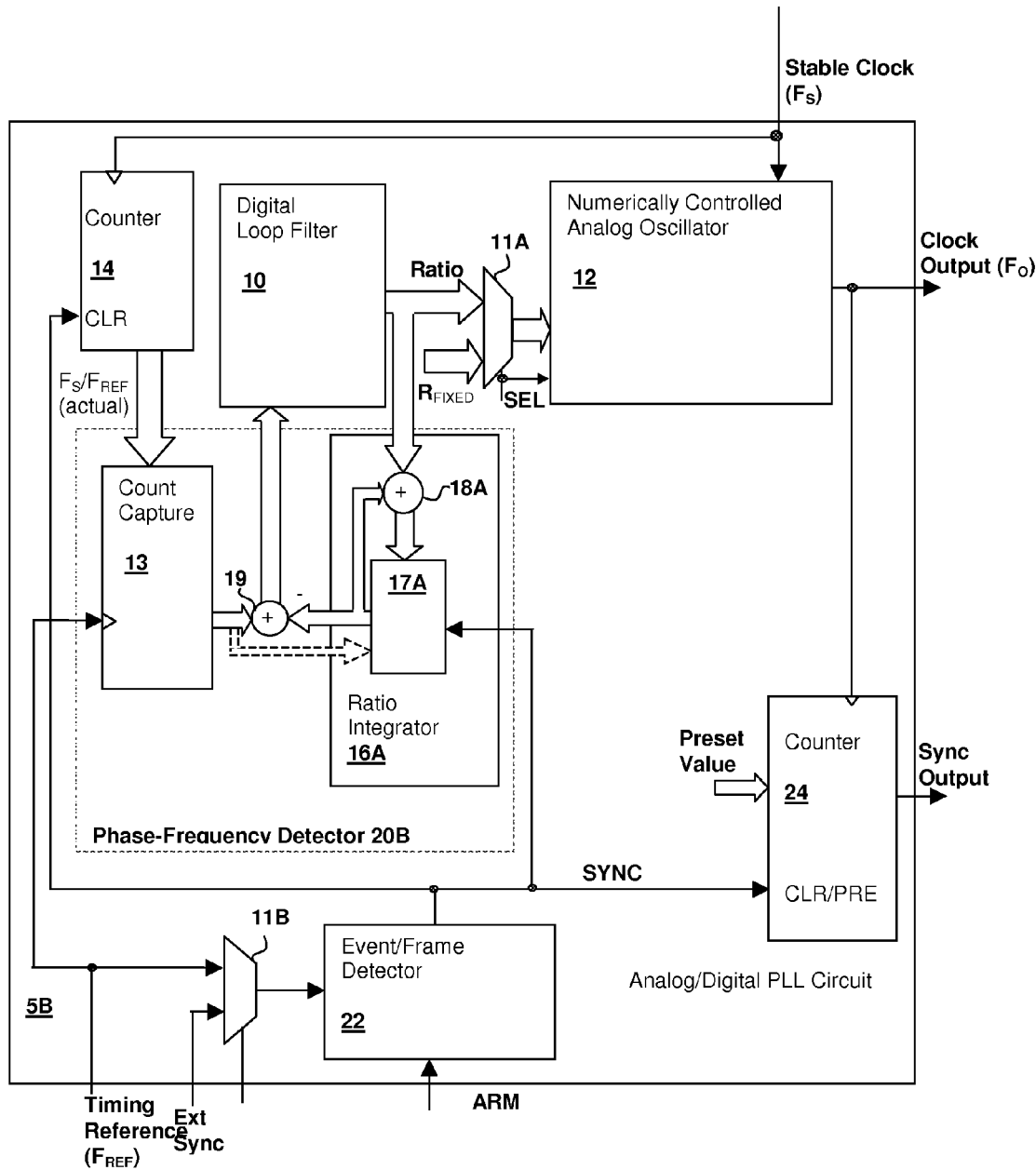
FIG. 2 is a block diagram depicting a circuit in accordance with another embodiment of the present invention.

Referring now to FIG. 2, a PLL circuit 5B in accordance with another embodiment of the invention is shown. The depicted embodiment is a feed-forward configuration of a hybrid analog/digital PLL circuit 5B, with no feedback provided from the low-jitter Clock Output signal to the front-end digital phase lock loop. PLL circuit 5B of FIG. 2 is similar to PLL circuit 5A of FIG. 1 and therefore only differences between the two circuits will be discussed in detail below. In the depicted embodiment, the phase comparator is still implemented by a subtractor 19, but overall a phase-frequency comparator 20B in the depicted embodiment differs in structure from that of phase comparator 20A of FIG. 1. In phase comparator 20B, the phase inputs are derived in a manner different from that illustrated in the embodiment of FIG. 1. It is understood that either phase comparison strategy may be employed in either a feedback or feed-forward configuration with appropriate modifications. However, it is advantageous to use phase-frequency comparator 20A of FIG. 1 in feedback configurations due to the actual feedback from the clock output, while phase-frequency comparator 20B is simpler.

In the feed-forward PLL circuit 5B of FIG. 2, counter 14 is clocked by the Stable Clock signal, and numerically controlled analog oscillator 12 is operated without global feedback, so that the Ratio number is not adjusted in response to variation in the Clock Output signal frequency, but is adjusted in conformity with any variation in the Stable Clock signal frequency. Count capture circuit 13 captures the count value at edges of the Timing Reference signal, as in the circuit of FIG. 1. However, the count value in the depicted embodiment represents the ratio of $F_S/F_{REF}$ and is therefore not dependent on the frequency of the Clock Output signal. The output of count capture circuit 13 is compared with an accumulated phase number that is directly integrated from the Ratio control number by ratio integrator 16A, which includes a summer 18A and latch 17A as in ratio integrator 16 of FIG. 1. Since the Ratio control number represents a frequency, an integration of the Ratio control number represents the phase and can be used directly in the feed-forward implementation without the introduction of additional fixed ratio Ratio2 to accumulate as in the circuit of FIG. 1. Just as described above with reference to FIG. 1, event/frame detector circuit 22 also provides a SYNC signal synchronous with detection and/or receipt of high-level events, and either resets latch 17A or presets latch 17A to the output value from count capture circuit 13, so that the accumulated phase error is reset in response to the SYNC signal. Counter 14 is also optionally reset or preset to a predetermined value, and a secondary synchronization output counter 24 may also be employed in the circuit of FIG. 2 and either reset or set to a Preset Value, in response to the SYNC signal.

Figure 3:
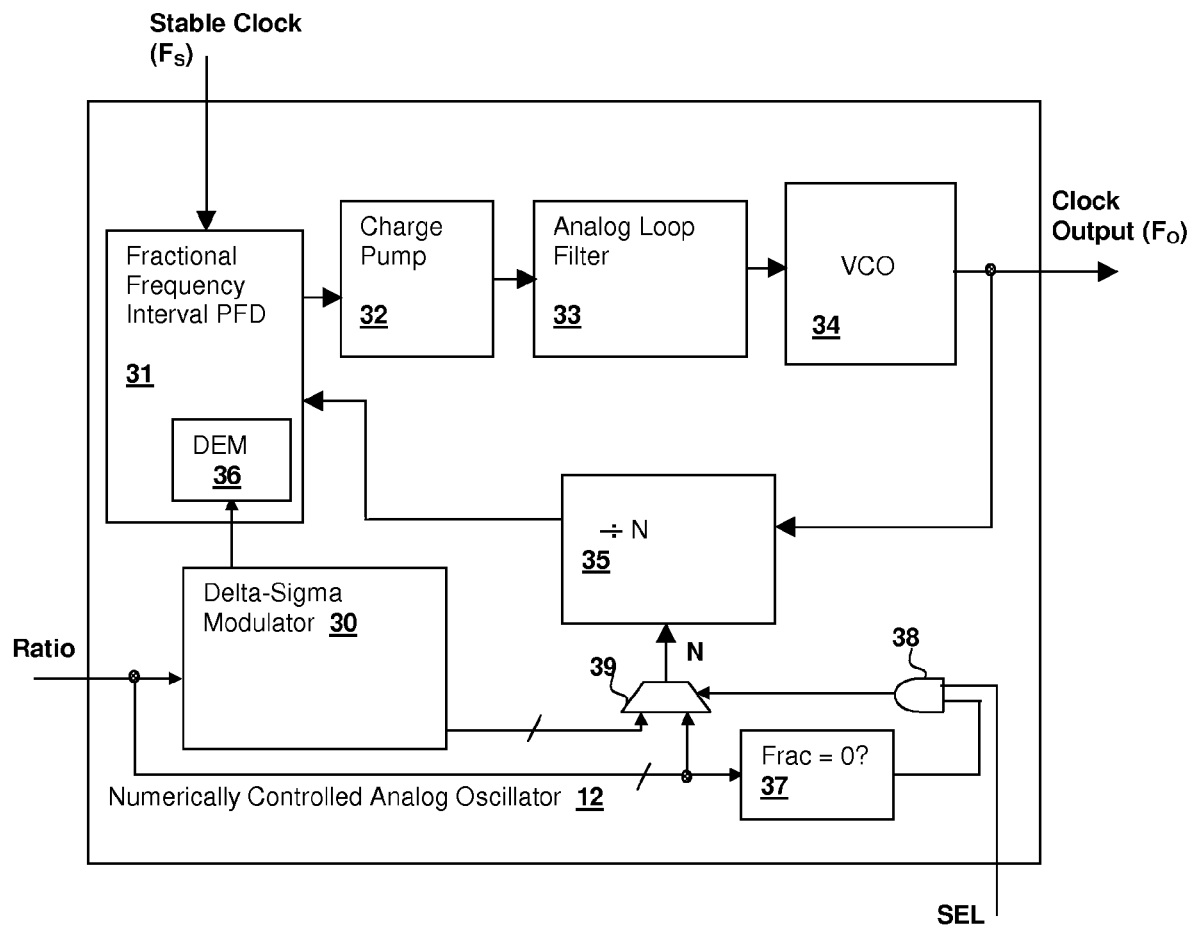
FIG. 3 is a block diagram depicting details of an exemplary numerically controlled analog oscillator 12 that may be used in the circuits of FIG. 1 and FIG. 2.

Referring now to FIG. 3, an exemplary circuit that can be used to implement numerically controlled analog oscillator 12 in PLL circuits 5A and 5B of FIG. 1 and FIG. 2 is shown. The depicted circuit is disclosed in detail in U.S. Pat. No. 7,049,852, entitled "FRACTIONAL-INTEGER PHASE-LOCKED LOOP SYSTEM WITH A FRACTIONAL-FREQUENCY-INTERVAL PHASE FREQUENCY DETECTOR", issued to John L. Melanson on May 23, 2006, which is incorporated herein by reference. Furthermore, FIG. 1 of the above-incorporated U.S. patent discloses another numerically-controlled analog oscillator that may be alternatively used to implement numerically controlled analog oscillator 12 in the circuits of FIG. 1 and FIG. 2 if the wider-bandwidth and otherwise higher performance of the circuit depicted in FIG. 3 is not required for a given application. The circuit of FIG. 3 provides a low-jitter Clock Output signal that is determined by an input Ratio number and the frequency of the Stable Clock signal.

The Clock Output signal is provided from a voltage-controlled analog oscillator (VCO) 34 that receives a frequency control voltage from an analog loop filter 33. A fractional frequency interval phase-frequency detector (PFD) 31 provides a correction signal to charge pump 32, which is then filtered by analog loop filter 33 to generate the frequency control voltage. Fractional frequency interval PFD 31 compares the frequency and phase of the Stable Clock signal to the output of a divider 35 that divides the Clock Output signal by an integer value N. A delta-sigma modulator 30 varies integer value N according to the Ratio value and the noise shaping transfer function of delta-sigma modulator 30 so that the average frequency at the output of divider 35 is equal to the frequency $F_S$ of the Stable Clock signal. As mentioned above, when the SEL signal indicates that a fixed ratio $R_{FIXED}$ is being provided as the Ratio value, and the Ratio value has no fractional part as determined by comparison logic 37, then logical AND gate 38 selects the Ratio value via multiplexer 39 as the division factor of divider 35, rather than the output of delta-sigma modulator 30, to reduce tracking error and noise. A dynamic element matching block (DEM) 36 in fractional frequency interval PFD 31 receives the modulator feedback signal from delta-sigma modulator 30. The DEM 36 provides for matching of individual elements in fractional frequency interval PFD 31, which actually comprises multiple parallel phase-frequency detectors having inputs provided from a selection between the output of divider 35 and a delayed version of the output of divider 35, as described in further detail in the above-incorporated U.S. patent.

Figure 4:
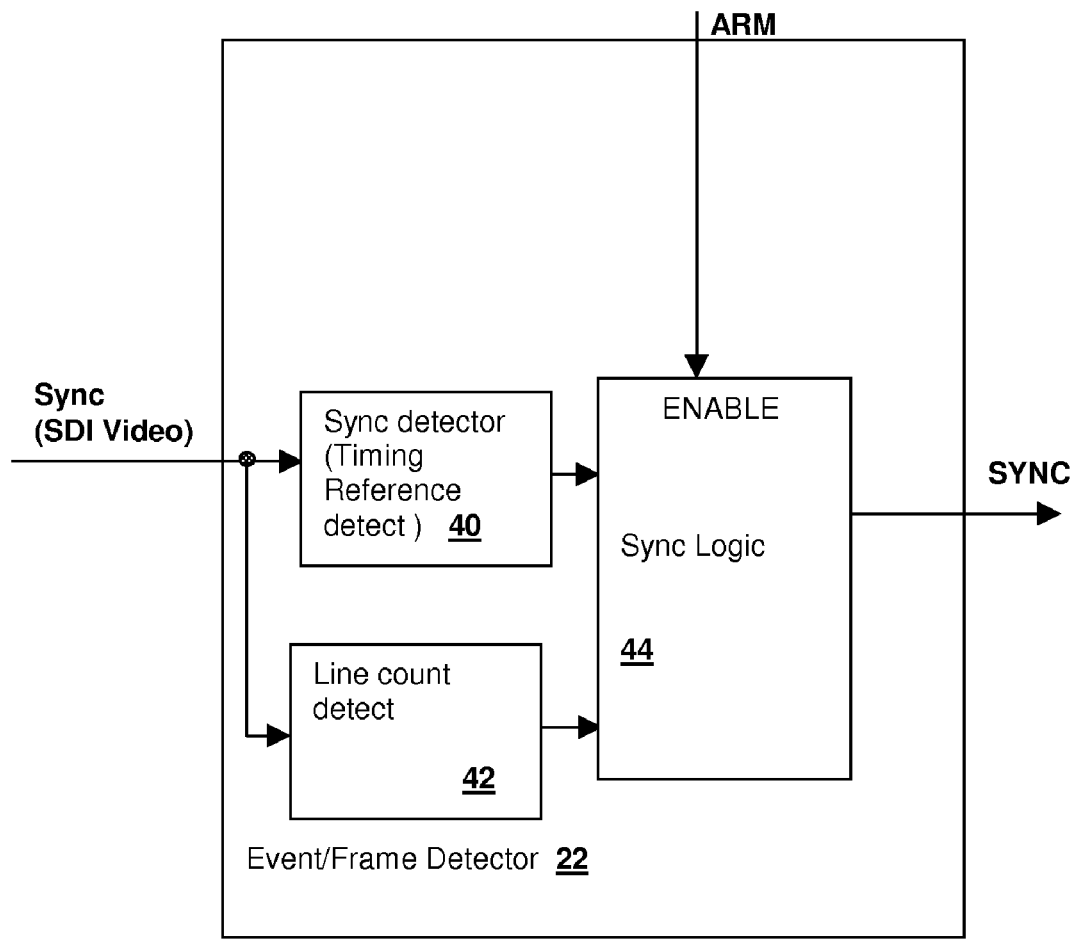
FIG. 4 is a block diagram depicting details of an exemplary Event/Frame detector circuit 22 that may be used in the circuits of FIG. 1 and FIG. 2.

Referring now to FIG. 4, details of event/frame detector circuit 22 are shown in accordance with an exemplary embodiment of the invention, as may be used in the circuits of FIG. 1 and FIG. 2. It is understood that the present invention applies to applications other than video synchronization, but for illustrative purposes, a video synchronization circuit is illustrated. A Sync signal, from which high-level event synchronization information may be derived, is illustrated by a Serial Digital Interface (SDI) video source signal provided at an input to event/frame detector 22. A line count detect circuit 42 detects the line count field from the SDI video stream, and a sync detector circuit 40 detects the Timing Reference events in the SDI video stream. A synchronization logic circuit 44 combines the line count and timing reference information to determine the high-level synchronization times and is enabled by the ARM signal so that the SYNC signal is asserted for a high-level event occurring after the ARM signal has been asserted. Generally, only one SYNC pulse will be generated for the high-level event, until the ARM signal is de-asserted and then re-asserted, but that is not a limitation of the invention.

Figure 5A:
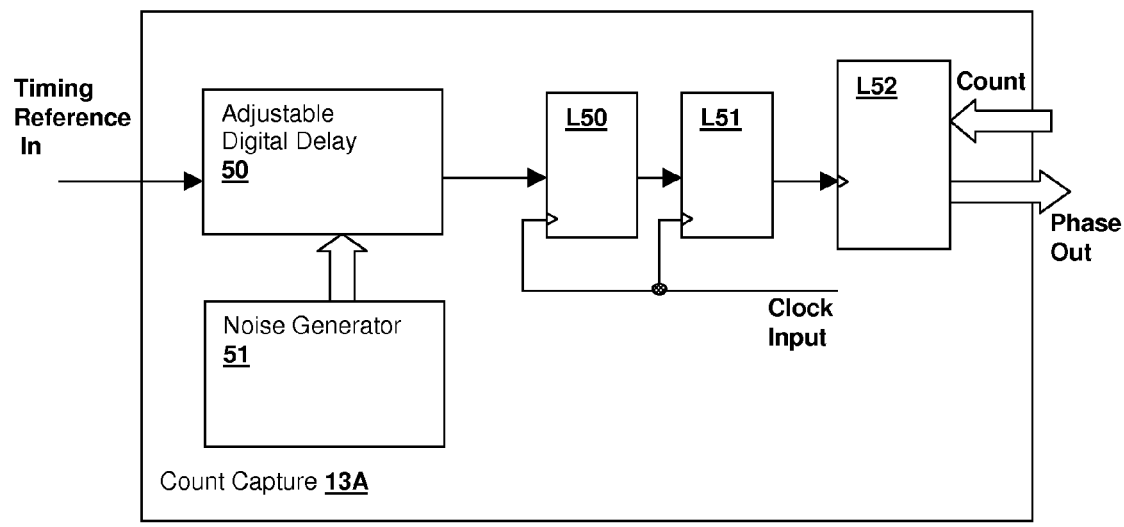
FIGS. 5A-5B are schematic diagrams of count capture circuits that may be used to implement count capture circuit 13 in the circuits of FIG. 1 and FIG. 2.

Referring now to FIG. 5A, a count capture circuit 13A that can be used to implement count capture circuit 13 of FIG. 1 and FIG. 2 is illustrated. Due to the sampling of the output of counter 14 by the edges of the Timing Reference signal, jitter tones can be generated by the sampling action. Dithering is applied to effectively remove the jitter tones by spreading their energy over a broad frequency range. In the depicted embodiment, an adjustable digital delay 50, which may be a shift register with a tap selector, is controlled by a noise generator 51 that varies the delay pseudo-randomly. The output of adjustable digital delay 50 is stabilized by a pair of latches L50 and L51, which are clocked by a Clock Input signal. The Clock Input signal is provided from the Clock Output signal in the embodiment of FIG. 1 or the Stable Clock signal in the embodiment of FIG. 2. A third latch L52 is clocked by the dithered Timing Reference signal and captures the Count output of counter 14 to generate the phase number output of count capture circuit 13.

Figure 5B:
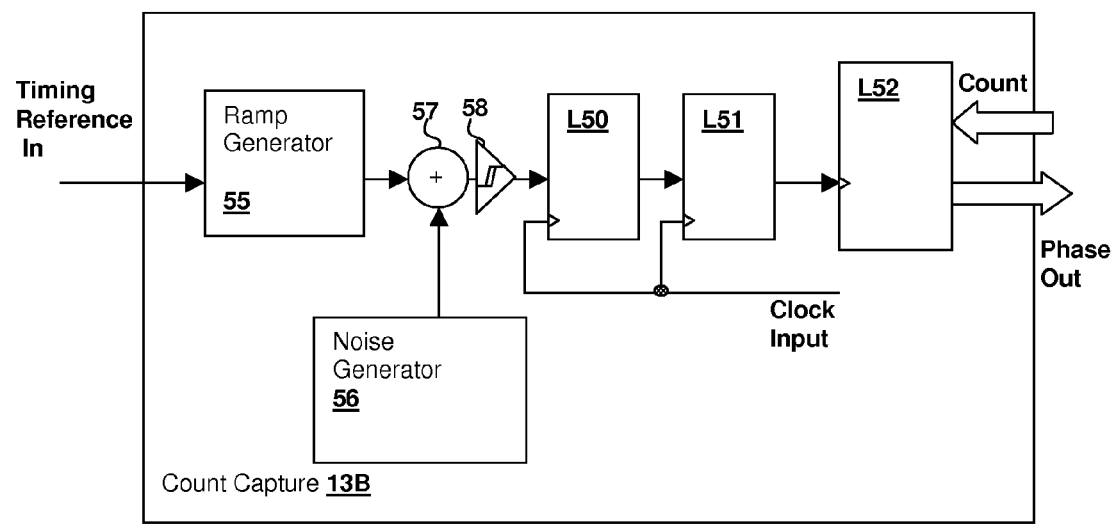

Referring now to FIG. 5B, a count capture circuit 13B that can alternatively be used to implement count capture circuit 13 of FIG. 1 and FIG. 2 is illustrated. An analog ramp generator 55 is triggered by edges of the Timing Reference signal and the output of ramp generator 55 is summed with the output of an analog noise generator 56 by a summer 57. A hysteresis comparator 58 compares the output of summer 57 with a threshold to generate the input to latch L50. The balance of the circuit operates as described above with respect to FIG. 5A.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit for providing a low-jitter clock output synchronized to a timing reference having jitter, said circuit comprising:
    a numerically-controlled analog oscillator for providing said clock output and having an input for receiving a rational numeric representation of a ratio between a frequency of said clock output and a frequency of a stable clock for controlling said frequency of said clock output;
    a counter for dividing a frequency of one of said clock output or said stable clock;
    a digital phase-frequency detector for generating a representation of an on-going phase-frequency difference between said timing reference and an output of said counter;
    a digital loop filter for filtering said representation of said on-going phase-frequency difference to provide said rational numeric representation to said numerically-controlled analog oscillator; and
    a control circuit having a synchronization input for receiving a synchronization event signal, wherein said control circuit has an output coupled to said digital phase-frequency detector for resetting an accumulated phase error of said digital phase-frequency detector in response to said synchronization event signal.

2. The circuit of claim 1, wherein said control circuit further sets a count value of said counter in response to said synchronization event signal.

3. The circuit of claim 1, further comprising a second counter for providing a high-level synchronization output, wherein said second counter has a clock input coupled to said clock output.

4. The circuit of claim 3, wherein said control circuit sets a count value of said second counter in response to said synchronization event signal.

5. The circuit of claim 1, wherein said control circuit further includes an arming input, wherein said control circuit only resets said accumulated phase error of said digital phase-frequency detector in response to a next synchronization event signal after said arming input is activated.

6. The circuit of claim 1, wherein said synchronization input is coupled to a timing reference input that provides said timing reference to said circuit.

7. The circuit of claim 5, wherein said control circuit further comprises an event detector for extracting said synchronization event signal from said timing reference input.

8. The circuit of claim 1, wherein said counter divides said frequency of said clock output, wherein said counter provides phase-frequency feedback from said clock output of said numerically-controlled analog oscillator, whereby said numerically-controlled analog oscillator is controlled by said feedback.

9. The circuit of claim 1, wherein said counter divides said frequency of said stable clock, whereby said numerically-controlled analog oscillator is operated in a feed-forward mode.

10. A method of providing a low-jitter clock signal synchronized to a timing reference having jitter, said method comprising:
    generating a clock output from a numerically-controlled analog oscillator ratiometrically locked to a stable clock source, wherein a frequency of said clock output is controlled by a rational numeric representation of a ratio between a frequency of said clock output and a frequency of said stable clock;
    dividing a frequency of one of said clock output or said stable clock;
    generating a representation of an on-going phase-frequency difference between said timing reference and a result of said dividing;
    filtering said representation of said on-going phase-frequency difference with a digital filter to provide said rational numeric representation to said numerically-controlled analog oscillator;
    receiving a synchronization event signal; and
    resetting an accumulated phase error of said digital phase-frequency detector in response to receiving said synchronization event signal.

11. The method of claim 10, further comprising setting a phase of said dividing in response to receiving said synchronization event signal.

12. The method of claim 10, further comprising generating a high-level synchronization output from said clock output.

13. The method of claim 12, further comprising wherein said control circuit sets a phase of said high-level synchronization output in response to receiving said synchronization event signal.

14. The method of claim 10, further comprising receiving an arming indication, and wherein said resetting said accumulated phase error is performed only in response to a next synchronization event signal after said arming indication is received.

15. The method of claim 10, wherein said receiving said synchronization signal receives a signal derived from a timing reference signal providing said timing reference.

16. The method of claim 15, further comprising detecting an event represented in said timing reference signal to generate said synchronization event signal.

17. The method of claim 10, wherein said dividing comprises dividing said frequency of said clock output to provide phase-frequency feedback from said clock output, whereby said frequency of said clock output is controlled by said feedback.

18. The method of claim 10, wherein said dividing comprises dividing said frequency of said stable clock, whereby said numerically-controlled analog oscillator is operated in a feed-forward mode.

19. A circuit for providing a low-jitter clock output synchronized to a timing reference having jitter, said circuit comprising:
- a numerically-controlled analog oscillator for providing said clock output and having an input for receiving a rational numeric representation of a ratio between a frequency of said clock output and a frequency of a stable clock for controlling said frequency of said clock output;
- a counter for dividing a frequency of one of said clock output or said stable clock;
- a digital phase-frequency detector for generating a representation of an on-going phase-frequency difference between said timing reference and an output of said counter;
- a digital loop filter for filtering said representation of said on-going phase-frequency difference to provide said rational numeric representation to said numerically-controlled analog oscillator; and
- means for resetting an accumulated phase error of said digital phase-frequency detector in response to a synchronization event.

20. The circuit of claim 19, further comprising means for resetting a value of said phase-frequency difference in response to said synchronization event.

* * * * *